(12) United States Patent
Kristal

(10) Patent No.: US 10,025,158 B2
(45) Date of Patent: Jul. 17, 2018

(54) LIGHT EMITTING DISPLAY DEVICE AND METHOD FOR MANUFACTURING THE SAME

(71) Applicant: BOE TECHNOLOGY GROUP CO., LTD., Beijing (CN)

(72) Inventor: Boris Kristal, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/525,863

(22) PCT Filed: Jun. 27, 2016

(86) PCT No.: PCT/CN2016/087282
§ 371 (c)(1),
(2) Date: May 10, 2017

(87) PCT Pub. No.: WO2017/152545
PCT Pub. Date: Sep. 14, 2017

(65) Prior Publication Data
US 2018/0074381 A1    Mar. 15, 2018

(30) Foreign Application Priority Data

Mar. 9, 2016  (CN) .......................... 2016 1 0132761

(51) Int. Cl.
| | |
|---|---|
| *G02F 1/19* | (2006.01) |
| *H01L 27/12* | (2006.01) |
| *G02F 1/29* | (2006.01) |
| *H01L 27/32* | (2006.01) |
| *G02F 1/23* | (2006.01) |
| *G02F 3/02* | (2006.01) |
| *H01L 51/52* | (2006.01) |

(52) U.S. Cl.
CPC ................. *G02F 1/19* (2013.01); *G02F 1/29* (2013.01); *H01L 27/124* (2013.01);
(Continued)

(58) Field of Classification Search
CPC ......... G02F 1/133553; G02F 1/133555; G02F 1/19; G02F 1/23; G02F 1/29; G02F 3/00;
(Continued)

(56) References Cited

U.S. PATENT DOCUMENTS

| | | | | |
|---|---|---|---|---|
| 6,777,885 B2 * | 8/2004 | Koyama | ............... | G09G 3/3241 315/169.1 |
| 6,958,796 B2 * | 10/2005 | Takizawa | .......... | G02F 1/133553 349/106 |
| 7,586,254 B2 * | 9/2009 | Kwak | ................... | G09G 3/3233 257/88 |
| 8,058,709 B2 * | 11/2011 | Moriwaka | ........... | H01L 21/2026 257/628 |

(Continued)

FOREIGN PATENT DOCUMENTS

| | | |
|---|---|---|
| CN | 1392967 A | 1/2003 |
| CN | 102939656 A | 2/2013 |

(Continued)

OTHER PUBLICATIONS

International Search Report from corresponding PCT Application No. PCT/CN2016/087282 (5 pages).

(Continued)

*Primary Examiner* — Loha Ben
(74) *Attorney, Agent, or Firm* — Harness, Dickey & Pierce, P.L.C.

(57) ABSTRACT

Embodiments of the present disclosure relate to a light emitting display device and a method for manufacturing the same. The light emitting display device comprises one or more pixel units, each of which is provided with a transparent light emitting device on a substrate, wherein at least a part of the pixel units are provided with a switchable mirror, which is located between the substrate and the light emitting device and is switchable between a transmission mode and a reflection mode.

18 Claims, 2 Drawing Sheets

(52) U.S. Cl.
CPC ............ *H01L 27/1259* (2013.01); *G02F 1/23* (2013.01); *G02F 3/02* (2013.01); *G02F 2201/12* (2013.01); *G02F 2201/123* (2013.01); *G02F 2201/34* (2013.01); *G02F 2203/01* (2013.01); *G02F 2203/02* (2013.01); *H01L 27/3211* (2013.01); *H01L 27/3248* (2013.01); *H01L 51/5271* (2013.01); *H01L 2227/323* (2013.01)

(58) Field of Classification Search
CPC .. G02F 3/02; G02F 2201/12; G02F 2201/123; G02F 2201/34; G02F 2203/01; G02F 2203/02; G02F 2203/09; F21V 14/00; H01L 27/0013; H01L 27/124; H01L 27/1251; H01L 27/1259; H01L 27/32; H01L 27/3211; H01L 27/3206; H01L 27/3209; H01L 27/3232; H01L 27/3244; H01L 27/3246; H01L 27/3248; H01L 27/3258; H01L 27/62; H01L 27/326; H01L 27/56; H01L 21/2026; H01L 51/5012; H01L 51/5271; H01L 51/5281; H01L 2227/32; H01L 2227/323
USPC ....... 359/245, 263, 298, 315, 318, 385, 630; 257/E33.001, E33.013, 64, 98, 107, 257/163–165; 438/22, 28, 29, 34, 758, 438/760; 349/11, 15, 16
See application file for complete search history.

(56) References Cited

U.S. PATENT DOCUMENTS

| | | | |
|---|---|---|---|
| 9,147,862 B2 * | 9/2015 | Kim | .......................... H01L 51/56 |
| 2011/0267279 A1 | 11/2011 | Alvarez Rivera et al. | |
| 2011/0310458 A1 | 12/2011 | Lee et al. | |
| 2015/0048361 A1 | 2/2015 | Yamakita et al. | |
| 2015/0049287 A1 | 2/2015 | Chang et al. | |
| 2017/0292681 A1 * | 10/2017 | Lin | ..................... H01L 27/3209 |
| 2017/0294488 A1 * | 10/2017 | Lin | ..................... H01L 27/3209 |

FOREIGN PATENT DOCUMENTS

| | | |
|---|---|---|
| CN | 103887551 A | 6/2014 |
| CN | 104377306 A | 2/2015 |
| CN | 104952908 A | 9/2015 |
| CN | 105609537 A | 5/2016 |
| CN | 205542787 U | 8/2016 |
| KR | 101480948 B1 | 1/2015 |
| WO | WO-02-27395 A1 | 4/2002 |
| WO | WO-2011137232 A1 | 11/2011 |

OTHER PUBLICATIONS

Written Opinion of the International Searching Authority from corresponding PCT Application No. PCT/CN2016/087282 (4 pages).

* cited by examiner

LIGHT EMITTING DISPLAY DEVICE AND METHOD FOR MANUFACTURING THE SAME

CROSS-REFERENCE TO RELATED APPLICATIONS

This application claims priority of Chinese Patent Application No. 201610132761.1 filed on Mar. 9, 2016, the entire disclosure of which is incorporated herein by reference as a part of this application.

TECHNICAL FIELD

Embodiments of present disclosure relate to a light emitting display device switchable between transparent and non-transparent display types, and a method for manufacturing the same.

BACKGROUND

A current electro-luminescent display is of a self-emitting type and does not require a back light unlike a liquid crystal display (LCD), and thus weight reduction and slimness thereof are feasible. Further, the electro-luminescent display has a low driving voltage, a high luminous efficiency and a wide viewing angle, thus receiving attention as a next generation display.

Light emitting display devices can be generally classified into two types—transparent and conventional non-transparent displays. Transparent displays are simultaneously top and bottom emitting devices, have a reasonably high transmittance of visible light and can be used in the applications that require transparency, such as head-up displays, smart windows or augmented reality, but they cannot be used for non-transparent displays. Conventional non-transparent displays can emit light only in one direction, being either bottom light emitting devices or top light emitting devices. Although non-transparent displays have significantly higher brightness and efficiency compared to transparent displays, they cannot achieve transparent display for a reason that a conventional non-transparent display has one electrode with a reflective surface which reflects the generated light toward a second, transparent or semi-transparent, electrode. In contrast, a transparent display has two transparent or semi-transparent electrodes, and the light is emitted through both sides of the display.

The existing light emitting display devices are either transparent or non-transparent display devices, unable to work for both transparent display and non-transparent display, and thus are poor in operation convenience.

SUMMARY OF THE INVENTION

Embodiments of present disclosure provide a light emitting display device switchable between transparent and non-transparent display types and a method for manufacturing the same. A switchable mirror is arranged in a pixel unit for light-emission display such that the pixel works for transparent display or non-transparent display as required. Thus a user can switch the same product between transparent and non-transparent display types, and the operation convenience is improved.

A first aspect of the embodiments of present disclosure provides a light emitting display device comprising a plurality of pixel units, each of which is provided with a transparent light emitting device on a substrate, wherein at least a part of the pixel units are provided with a switchable mirror, which is located between the substrate and the light emitting device and is switchable between a transmission mode and a reflection mode.

According to this aspect, the switchable mirror which is switchable between a transmission mode and a reflection mode is incorporated into a pixel unit of the light emitting display device structure. The pixel can work for transparent display or non-transparent display as required, thereby easily and effectively switching the same light emitting display device between transparent and non-transparent display types and improving operation convenience.

In an exemplary embodiment of present disclosure, the switchable mirror is a metal-hydride switchable mirror. According to this exemplary embodiment, by taking advantage of high reflectivity of metal and high transmissivity of metal hydride, the metal-hydride switchable mirror is used to facilitate the switchable mirror to switch between the reflection mode and the transmission mode, thereby switching the same light emitting display device between transparent and non-transparent display types.

In an exemplary embodiment of present disclosure, the switchable mirror comprises a bottom transparent electrode, a hydrogen storage electrode, a proton conducting layer, an active layer switchable between a metallic reflection state and a metal hydride transmission state, and a sealing layer, which are stacked from bottom to top, wherein the proton conducting layer and the sealing layer are connected with each other. According to this exemplary embodiment, the active layer can be hydrogenated or dehydrogenated through applying electrical bias of different directions to the metal-hydride switchable mirror. The active layer exhibits a metal hydride transmission state when being hydrogenated (i.e., in a metal hydride form), and exhibits a metallic reflection state when being dehydrogenated (i.e., in an all-metal form), thereby switching the light emitting display device between transparent and non-transparent display types.

In an exemplary embodiment of present disclosure, the switchable mirror and the light emitting device are arranged to be directly opposite to each other. Such an arrangement can cause the light emitted from a side of the light emitting device facing the switchable mirror to be almost completely transmitted by the switchable mirror to reach the substrate in a transmission mode, and can cause the light emitted from a side of the light emitting device facing the switchable mirror to be almost completely reflected by the switchable mirror to return to the light emitting device without reaching the substrate in a reflection mode, thereby achieving efficient transmission in the transmission mode and efficient reflection in the reflection mode. That is, the light emitting device can work efficiently in each mode.

In an exemplary embodiment of present disclosure, a planarization layer is arranged between the switchable mirror and the light emitting device such that the switchable mirror and the light emitting device are directly opposite to each other. According to this exemplary embodiment, the use of the planarization layer makes the switchable mirror substantially parallel to the light emitting device on the substrate and makes it easier to arrange the switchable mirror and the light emitting device to be directly opposite to each other, so that the light emitting display device can work more efficiently in each mode.

In an exemplary embodiment of present disclosure, the switchable mirror has a thickness of 80 nm-120 nm. According to this exemplary embodiment, the switchable mirror will not significantly alter a thickness of the light emitting display device, thus an outer size of the resulting display will not be different from that of a conventional display.

In an exemplary embodiment of present disclosure, the light emitting display device further comprises a first switching transistor, a drain electrode of which is connected with the bottom transparent electrode, for controlling the switchable mirror to switch between the transmission mode and the reflection mode. According to this exemplary embodiment, a voltage can be applied to the switchable mirror via the first switching transistor to easily control the switchable mirror at a low control voltage so that the switchable mirror can switch between the transmission mode and the reflection mode.

In an exemplary embodiment of present disclosure, the light emitting display device further comprises a second switching transistor, a drain electrode of which is connected with a pixel electrode of the light emitting device, for controlling whether to provide a data signal to the light emitting device. According to this exemplary embodiment, a voltage can be applied to the light emitting device via the second switching transistor to easily control the light emitting device at a low control voltage and to lengthen lifetime of the light emitting device.

In an exemplary embodiment of present disclosure, the light emitting device comprises a pixel electrode, a light emitting layer, and a counter electrode opposite to the pixel electrode stacked in sequence. According to this exemplary embodiment, the light emitting device is formed using mature light emitting diode technology in the art, and thus the light emitting display device in present disclosure has a high yield and a low cost.

In an exemplary embodiment of present disclosure, the hydrogen storage electrode is made of a hydrogen storage alloy selected from at least one of $WO_3$, $NdMgNi_{4-a}Co_a$, $Ti_{0.5}Al_{0.25}Ni_{0.25}$ and $ZrMn_wM_xCr_yNi_z$, wherein in $NdMgNi_{4-a}Co_a$, a is in a range of 0-1.0; in $ZrMn_wM_xCr_yNi_z$, M is V or Mo, and $0.6 \leq w \leq 0.8$, $0.1 \leq x \leq 0.3$, $0 < y \leq 0.2$, $1.2 \leq z \leq 1.5$. These materials have high hydrogen storage capability, and thus the hydrogen storage electrode can store hydrogen efficiently and the switchable mirror has a wide control window.

In an exemplary embodiment of present disclosure, the proton conducting layer and the sealing layer are made of a proton conducting material selected from at least one of $ZrO_2$, $SrCeO_3$, $BaCeO_3$ and $BaZrO_3$, and $H^+$ is capable of being filled in pores of the proton conducting material. These materials have a good proton conducting property and protons can be efficiently conducted in these layers such that the switchable mirror can quickly switch between the transmission mode and the reflection mode in response to a control signal, thereby quickly switching the light emitting display device between transparent and non-transparent display types.

In an exemplary embodiment of present disclosure, the active layer is made of a material selected from at least one of GdMg, $Mg_2Ni$, YMg and LaMg. These materials have a high activity and can be easily and reversibly hydrogenated or dehydrogenated, thereby effectively switching the switchable mirror between the transmission mode and the reflection mode.

In an exemplary embodiment of present disclosure, each pixel unit comprises one or more subpixel units, each of which is provided with one said switchable mirror. According to this exemplary embodiment, each subpixel unit in each pixel unit is provided with one said switchable mirror. That is, the transmission/reflection switch is made in units of subpixels, which makes it possible to individually control the switch of display modes of each subpixel unit and to improve display flexibility of the light emitting display device.

In an exemplary embodiment of present disclosure, each pixel unit is a pixel unit composed of a plurality of subpixels in different colors, and the each pixel unit is provided with one said switchable mirror. According to this exemplary embodiment, each pixel unit composed of a plurality of subpixel units is provided with one said switchable mirror. That is, the transmission/reflection switch is made in units of pixels, which makes it possible to switch display modes with a relatively small number of switchable mirrors. Thus the light emitting display device is switched between transparent and non-transparent display types at a low cost.

A second aspect of embodiments of present disclosure provide a method for manufacturing a light emitting display device, the method comprising: forming, in at least a part of pixel units on a substrate, a switchable mirror which is switchable between a transmission mode and a reflection mode; and forming a transparent light emitting device on the switchable mirror.

According to this aspect, by forming, in at least a part of pixel units on a substrate, a switchable mirror which is switchable between a transmission mode and a reflection mode, the pixels can work for transparent display or non-transparent display as required. Thereby a light emitting display device switchable between transparent and non-transparent display types in a same product can be manufactured.

In an exemplary embodiment of present disclosure, the forming, in at least a part of pixel units on a substrate, a switchable mirror which is switchable between a transmission mode and a reflection mode comprises: forming a bottom transparent electrode on the substrate; forming a hydrogen storage electrode on the bottom transparent electrode; forming a proton conducting layer on the hydrogen storage electrode; forming, on the proton conducting layer, an active layer switchable between a metallic reflection state and a metal hydride transmission state; and forming a sealing layer on the active layer, wherein the proton conducting layer and the sealing layer are connected with each other. The switchable mirror included in the resulting light emitting display device comprises a bottom transparent electrode, a hydrogen storage electrode, a proton conducting layer, an active layer switchable between a metallic reflection state and a metal hydride transmission state and a sealing layer stacked from bottom to top. In this switchable mirror, the active layer can be hydrogenated or dehydrogenated. The active layer exhibits a metal hydride transmission state when being hydrogenated (i.e., in a metal hydride form), and exhibits a metallic reflection state when being dehydrogenated (i.e., in an all-metal form). Thereby a light emitting display device switchable between transparent and non-transparent display types can be manufactured.

In an exemplary embodiment of present disclosure, above method further comprises forming a first switching transistor and a second switching transistor before forming the switchable mirror, wherein the first switching transistor and the second switching transistor are formed through a same process; a drain electrode of the first switching transistor is connected with the bottom transparent electrode, for controlling the switchable mirror to switch between the transmission mode and the reflection mode; a drain electrode of the second switching transistor is connected with the pixel electrode of the light emitting device, for controlling whether to provide a data signal to the light emitting device. The use of the first switching transistor and the switching transistor easily and advantageously control the switchable mirror and the light emitting device at a low control voltage. Moreover, by forming the first switching transistor and the second switching transistor through the same process, processing steps can be reduced and thus manufacturing cost is lowered.

According to above technical solutions, in embodiments of present disclosure, a switchable mirror is provided in a pixel unit for light-emission display so that the pixel works for transparent display or non-transparent display as required, and a user can switch a same product between transparent and non-transparent display types, thereby improving operation convenience.

BRIEF DESCRIPTION OF THE DRAWINGS

In order to illustrate the technical solutions of embodiments of present disclosure more clearly, a brief introduction to figures used in the description to the embodiments is made as follows. Apparently, the figures described below merely relate to some embodiments of present disclosure. An ordinary person skilled in the art may obtain other figures based on these figures without creative work.

DETAILED DESCRIPTION OF THE INVENTION

The technical solutions of embodiments of present disclosure will be described clearly and thoroughly hereinafter in conjunction with drawings in the embodiments in order to make the purposes, technical solutions and advantages of the embodiments of present disclosure. Obviously, the embodiments described are only some rather than all of the embodiments of present disclosure. All other embodiments obtained by one ordinary person skilled in the art based on the described embodiments in present disclosure without creative work are within the scope of present disclosure.

In an exemplary embodiment of present disclosure, a light emitting display device switchable between transparent and non-transparent display types, and a method for manufacturing the same are provided. The light emitting display device comprises a plurality of pixel units, each of which is provided with a transparent light emitting device on a substrate, wherein at least a part of the pixel units are provided with a switchable mirror, which is located between the substrate and the light emitting device and is switchable between a transmission mode and a reflection mode.

It is well known to those skilled in the art that a pixel is a repeated unit that can emit light in a patterned light emitting display structure. Each pixel may consist of one or more subpixels. For example, in a panchromatic device, each pixel may consist of three or more subpixels in different colors; and in a monochromatic device, each pixel may consist of one subpixel. Each subpixel includes a light emitting device and a drive circuit thereof. The light emitting device in each subpixel may be an organic or inorganic electro-luminescent (EL) device.

By taking for example a case where each pixel includes one subpixel which includes one OLED and a switching transistor as a drive circuit of the OLED, description to an exemplary embodiment of present disclosure is made by referring to FIGS. 1-4.

Figure 1:
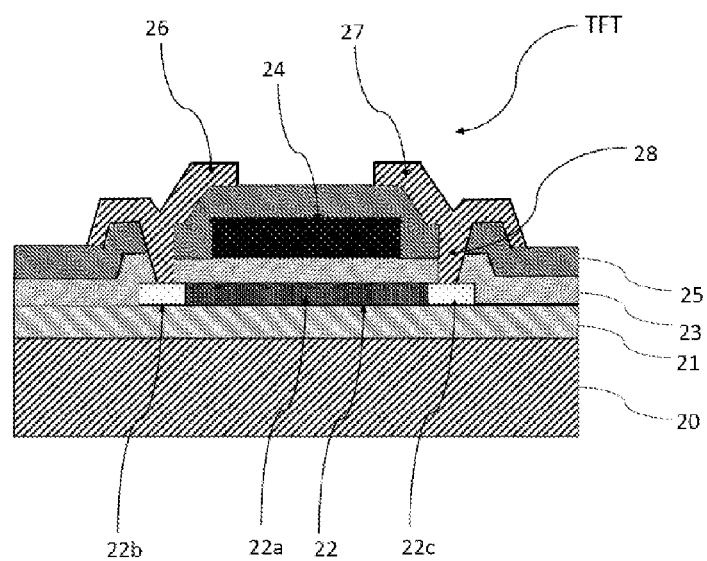
FIG. 1 is a cross-sectional view of a switching transistor that can be used in a light emitting display device according to an embodiment of present disclosure.

As shown in FIG. 1, a switching transistor, which can be used in the light emitting display device in an embodiment of present disclosure for driving the light emitting display device or for controlling the switchable mirror, is provided on a substrate 20. The substrate 20 may be formed from glass or plastic. A buffer layer 21 is formed on the substrate 20. An active layer 22, which comprises a channel region 22a, a source region 22b and a drain region 22c, is formed on the buffer layer 21. A gate insulation layer 23 is formed to cover the active layer 22. A gate electrode 24 is formed on the gate insulation layer 23, and an interlayer insulation layer 25 is formed to cover the gate electrode 24. A source electrode 26 and a drain electrode 27 are formed on the interlayer insulation layer 25. The source electrode 26 and the drain electrode 27 respectively contact the source region 22b and the drain region 22c of the active layer 22 through a contact hole 28 formed in the gate insulation layer 23 and the interlayer insulation layer 25. The active layer 22 may be formed of one of an inorganic semiconductor material and a semiconductor material. The source region 22b and the drain region 22c are doped with an n-type or p-type dopant, and the channel region 22a is formed to contact the source region 22b and the drain region 22c. Here, the channel region 22a, the source region 22b and the drain region 22c is collectively called the active layer 22. The gate electrode 24 may be formed of a conductive metal or other conductive material, such as a conductive polymer.

Figure 2:
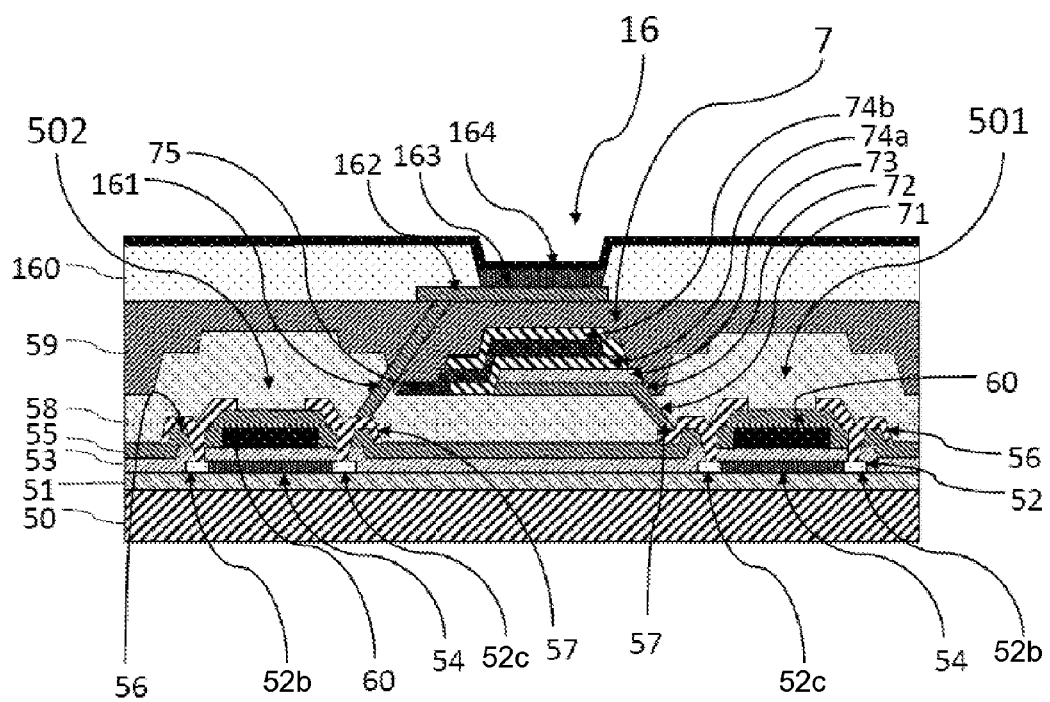
FIG. 2 is a cross-sectional view of an example of an electro-luminescent display device according to an embodiment of present disclosure.

FIG. 2 is a cross-sectional view of an example of an electro-luminescent display device according to an embodiment of present disclosure. This figure merely shows one pixel unit. However, the light emitting display device according to embodiments of present disclosure may comprise a plurality of pixel units. As shown in FIG. 2, at least one pixel unit of the light emitting display device is provided with a transparent light emitting device 16 on a substrate 50, and a switchable mirror 7, which is located between the substrate 50 and the light emitting device 16 and is switchable between a transmission mode and a reflection mode.

In this example, the switchable mirror 7 switchable between the transmission mode and the reflection mode is a metal-hydride switchable mirror. It should be noted that the switchable mirror 7 is not limited to a metal-hydride switchable mirror in embodiments of present disclosure, and other types of switchable mirrors switchable between a transmission mode and a reflection mode can also be used in the light emitting display device of present application.

Furthermore, in this example, the transparent light emitting device 16 on the substrate 50 may be an OLED. However, the light emitting device 16 is not limited to an OLED in embodiments of present disclosure. A person skilled in the art may conceive of any other type of organic or inorganic electro-luminescent device (EL) as the light emitting device.

FIG. 2 further shows a switching transistor 501 for controlling the switchable mirror 7 to switch between the transmission mode and the reflection mode, and a switching transistor 502 for controlling whether to provide a data signal to the light emitting device 16. However, it is necessary to point out that, in embodiments of present disclosure, the control circuit of the switchable mirror 7 and the drive circuit of the light emitting device 16 are not limited to switching transistors, and may be replaced with other control circuits/devices.

The switchable mirror 7 and the light emitting device 16 may be arranged to be directly opposite to each other. For example, a planarization layer 59 may be arranged between the switchable mirror 7 and the light emitting device 16 such that the switchable mirror 7 and the light emitting device 16 are directly opposite to each other. However, it is contemplated in the embodiments of present disclosure that the switchable mirror 7 and the light emitting device 16 may not be arranged to be directly opposite to each other.

FIG. 2 merely illustrates an exemplary embodiment and is not intended to limit present disclosure. A person skilled in the art will understand that the number of the light emitting device(s) opposite to the switchable mirror 7 and the drive circuit(s) thereof is not limited to one, and may be two or more, that each pixel unit may include one or more subpixel units, each of which may be provided with one said switchable mirror, and that each pixel unit may be formed of a plurality of subpixels in different colors, each of which may be provided with one said switchable mirror.

Specifically, in the example shown in FIG. 2, a buffer layer 51 may be disposed on the substrate 50 formed of glass or plastic, and switching transistors 501 and 502 may be disposed on the buffer layer 51. When the switching transistors 501 and 502 are formed, an active layer 52 having a predetermined pattern is disposed on the buffer layer 51. A gate insulation layer 53 is disposed on a channel region 54 of the active layer 52, and a gate electrode 60 is formed on a predetermined region of the gate insulation layer 53. The gate electrode 60 is connected to a gate line (not shown) for applying an on/off signal to the switching transistors 501 and 502. An interlayer insulation layer 55 is formed on the gate electrode 60, and a source electrode 56 and a drain electrode 57 are formed to respectively contact a source region 52$b$ and a drain region 52$c$ of the active layer 52 through a contact hole. A passivation layer 58 formed of $SiO_2$ or SiNx may be formed on the source electrode 56 and the drain electrode 57. A planarization layer 59 formed of an matter such as acryl, polyimide or benzocyclobutene (BCB) may be formed on the passivation layer 58.

Next, a switchable mirror 7 may be formed above the switching transistors 501 and 502 shown in FIG. 2. A bottom transparent electrode 72 (formed of ITO, IZO and the like) of the switchable mirror 7 is formed on the passivation layer 58. A hydrogen storage electrode 73 is formed on the bottom transparent electrode 72. The hydrogen storage electrode 73 may be made of at least one of hydrogen storage alloys such as $WO_3$, $NdMgNi_{4-a}Co_a$ (wherein a is in a range of 0-1.0, for example, a=0.0, 0.2, 0.4, 0.6, 0.8, 1.0), $Ti_{0.5}Al_{0.25}Ni_{0.25}$, and $ZrMn_wM_xCr_yNi_z$ (wherein M=V or Mo, and $0.6 \leq w \leq 0.8$, $0.1 \leq x \leq 0.3$, $0 < y \leq 0.2$, $1.2 \leq z \leq 1.5$). A proton conducting layer 74$a$ as an ion conductor for protons (hereinafter referred to as "proton conducting layer") is formed on the hydrogen storage electrode 73. The proton conducting layer 74$a$ extends above the hydrogen storage electrode 73 so that a portion of the proton conducting layer 74$a$ contacts the passivation layer 58. An active layer 75 switchable between a metallic reflection state and a metal hydride transparent state is formed on the proton conducting layer 74$a$ so that part of the proton conducting layer 74$a$ is in contact with the passivation layer 58. For example, when not hydrogenated, the active layer 75 may be formed from GdMg, and when being hydrogenated, the active layer 75 can be expressed as GdMgHx (wherein x can change from 0 (all metal) to 5 (completely hydrogenated), i.e., $0 \leq x \leq 5$). Other examples for the forming material of the active layer 75 when not hydrogenated may include $Mg_2Ni$, YMg or LaMg and the like. That is, the active layer 75 may be formed from at least one of GdMg, $Mg_2Ni$, YMg and LaMg. A sealing layer 74$b$ ((hereinafter referred to as "sealing layer")) is formed on the top of the active layer 75 while maintaining contact with the proton conducting layer 74$a$, i.e., in connection with the proton conducting layer 74$a$. Here, the proton conducting layer 74$a$ and the sealing layer 74$b$ may be formed of at least one proton conducting material selected from a group consisting of $ZrO_2$, $SrC_eO_3$, $BaCeO_3$, $BaZrO_3$ and etc, and $H^+$ (i.e., protons) can be filled in pores of these proton conducting materials. The proton conducting layer 74$a$ and the sealing layer 74$b$ can be made from the same material. The bottom transparent electrode 72 is connected to a drain electrode 57 of the switching transistor 501 through a contact hole 71, and is connected to an electrode line through a lead (not shown).

That is, the switchable mirror 7 may comprise the bottom transparent electrode 72, the hydrogen storage electrode 73, a proton conducting layer 74$a$ as an ion conductor for protons, the active layer 75 switchable between a metallic reflection state and a metal hydride transmission state, and a sealing layer 74$b$, which are stacked from bottom to top, wherein the proton conducting layer 74$a$ and the sealing layer 74$b$ are connected with each other.

In the example shown in FIG. 2, the light emitting display device may comprise a first switching transistor 501, the drain electrode 57 of which is connected with the bottom transparent electrode 72, for controlling the switchable mirror 7 to switch between a transmission mode and a reflection mode.

The switchable mirror 7 can be formed using ultra high vacuum (UHV) electronic gun deposition, pulsed laser deposition, sputtering or the like, which makes it easy to apply to a light emitting device manufacture process.

The whole switchable mirror 7 forms a very thin film, the thickness of which may be 80 nm-120 nm, e.g., about 100 nm. Therefore the switchable mirror will not significantly alter a thickness of the light emitting display device, thus an outer size of the resulting display will not be different from that of a conventional display.

After the metal-hydride switchable mirror 7 is formed on the passivation layer 58, a layer formed of an matter such as acryl, polyimide or benzocyclobutene (BCB) is formed on the structure formed above and is planarized to form a planarization layer 59.

Next, a light emitting device (an OLED in this example) 16 is formed on the planarization layer 59. Specifically, a patterned pixel defining layer 160 is formed on the planarization layer 59. The pixel defining layer 160 has an opening that can be directly opposite to the switchable mirror 7. A pixel electrode 162, a light emitting layer 163 and a counter electrode 164 directly opposite to the pixel electrode 162 are formed inside the opening of the pixel limiting layer 160. The pixel electrode 162 can be connected to the drain electrode 57 of the switching transistor 502 through a contact hole 161 and receive, for example, a positive voltage from the drain electrode 57. The counter electrode 164 may cover the entire pixel electrode 162 and supply, for example, a negative voltage to the pixel electrode 162.

The pixel electrode 162 and the counter electrode 164 are insulated from each other by the light emitting layer 163. The light emitting layer 163 emits light as the pixel electrode 162 and the counter electrode 164 apply voltages having different polarities to the light emitting layer 163.

In other words, the light emitting device 16 according to an embodiment of present disclosure may comprise the second switching transistor 502, the drain electrode 57 of which is connected with the pixel electrode 162 of the light emitting device 16, for controlling whether to provide a data signal to the light emitting device 16.

Further, if the light emitting display device according to an embodiment of present disclosure comprises the first switching transistor 501 and the second switching transistor 502, the first switching transistor 501 and the second switching transistor 502 can be formed through the same process, thereby reducing processing steps and lowering a manufacturing cost.

If an electrical bias is applied to the switchable mirror 7 using the bottom transparent electrode 72 connected with the drain electrode 57 of the switching transistor 501 and the active layer 75 connected to a lead so that the bottom transparent electrode 72 becomes positively charged and the active layer 75 becomes negatively charged, hydrogen begins to flow from the hydrogen storage electrode 73 into the active layer 75 where a metal hydride is formed, that is, the active layer 75 is hydrogenated. When the active layer 75 hydrogenates, the metal-hydride switchable mirror 7 becomes transparent with maximum transmissivity of 90% in an optically open state. At this time, light emitted from the pixel electrode 162 of the light emitting device 16 can transmit through the transparent metal-hydride switchable mirror 7, and is further emitted from both the substrate 50 and the counter electrode 164 so that the light emitting display device shown in FIG. 2 is entirely transparent, that is, the light emitting display device is in a transparent display mode.

On the other hand, if an electrical bias is applied to the metal-hydride switchable mirror 7 using the bottom transparent electrode 72 connected with the drain electrode 57 of the switching transistor 501 and the active layer 75 connected to a lead so that the bottom transparent electrode 72 becomes negatively charged and the active layer 75 becomes positively charged, hydrogen begins to flow from the active layer 75 into the hydrogen storage electrode 73, and the active layer 75 becomes metallic, that is, the active layer 75 is dehydrogenated. When the active layer 75 is metallic (hydrogenated), the metal-hydride switchable mirror 7 becomes metallically reflective with a maximum reflectivity of 70% in an optically closed state. At this time, light emitted from the pixel electrode 162 of the light emitting device 16 is reflected by the metallically reflective active layer 75 of the metal-hydride switchable mirror 7 to return back to the pixel electrode 162, and further is emitted only from the counter electrode 164 so that the light emitting display device shown in FIG. 2 is non-transparent, that is, the light emitting display device is in a non-transparent display mode.

In this way, the control circuit (e.g., the switching transistor 501) of the switchable mirror 7 can be used to control polarities of charges carried on the bottom transparent electrode 72 and the active layer 75 to switch the switchable mirror 7 between a transmission state and a reflection state. Thus the light emitting display device provided in the embodiments of present disclosure can freely switch between a transparent display mode and a non-transparent display mode.

In the manufacturing method above, the processes used in respective steps are conventional processes in the art, and thus are not specifically restricted here.

Figure 3:
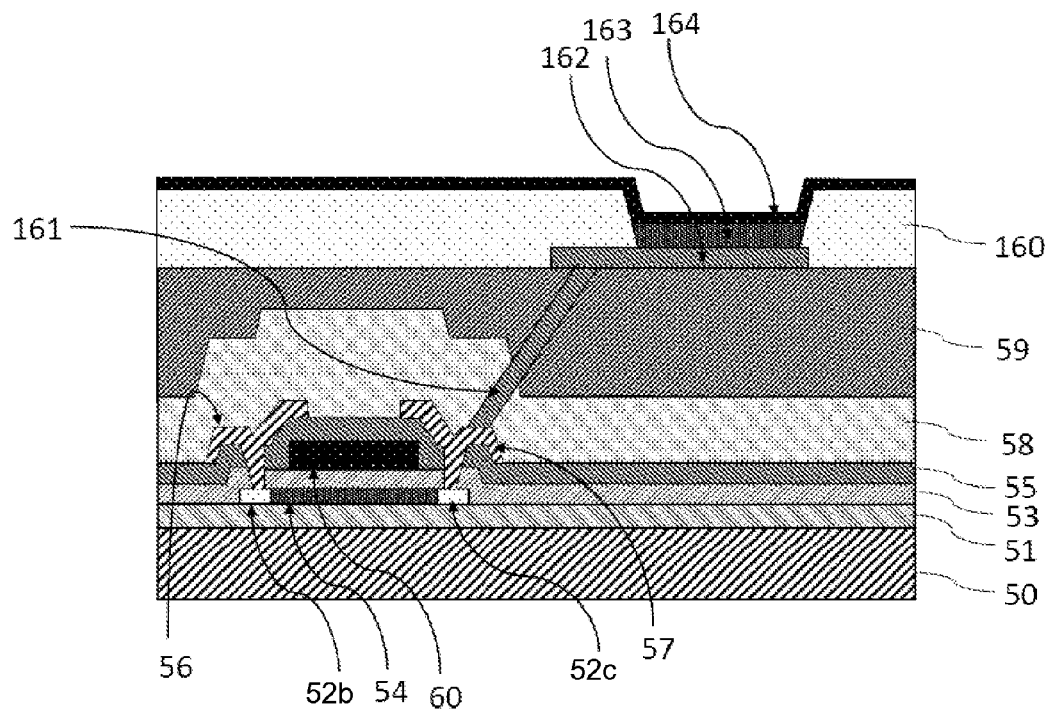
FIG. 3 is a cross-sectional view of a conventional light emitting display device.

In order to compare with the exemplary embodiment of present disclosure, a cross-sectional view of a conventional electro-luminescent display device is shown in FIG. 3. The electro-luminescent display device does not have the switchable mirror 7 shown in FIG. 2 and the switching transistor 501 for applying a control voltage to the metal-hydride switchable mirror 7.

Obviously, in the conventional electro-luminescent display device shown in FIG. 3, there is no switchable mirror that is switchable between a transmission state and a reflection state, so the electro-luminescent display device cannot switch between a transparent display mode and a conventional non-transparent display mode.

Figure 4:
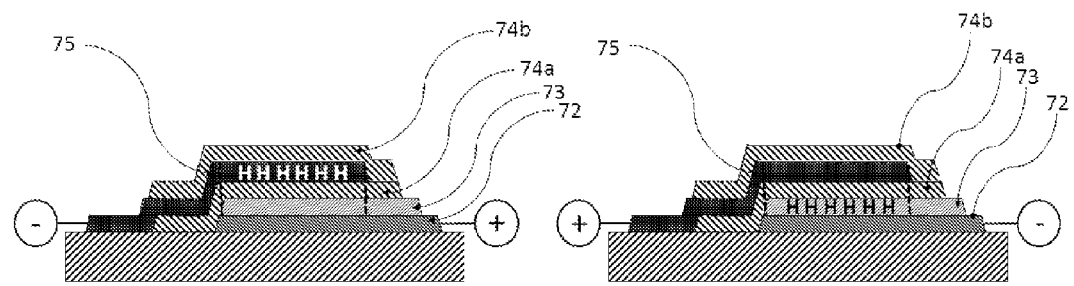
FIG. 4 is a cross-sectional view illustrating working principles of a metal-hydride switchable mirror.

FIG. 4 is a cross-sectional view schematically showing working principle of a metal-hydride switchable mirror. When a forward electrical bias is applied such that the bottom transparent electrode 72 works as a positive electrode (anode) and the active layer works as a negative electrode (cathode), hydrogen begins to flow from the hydrogen storage electrode 73 into the active layer 75 through the proton conducting layer 74*a*. With the proton concentration increasing, the active layer 75 becomes hydrogenated and takes a transparent metal hydride form. When a reverse electrical bias is applied such that the bottom transparent electrode 72 works as a negative electrode (cathode) and the active layer works as a positive electrode (anode), hydrogen begins to flow from the active layer 75 into the hydrogen storage electrode 73 through the proton conducting layer 74*a*. Upon dehydrogenation, the active layer 75 takes its metallic form and becomes a highly reflective mirror-like film.

In its hydrogenated form, the metal-hydride switchable mirror has a maximum transmissivity of 90% in visible range, for example, the transmissivity may be 60%-90%, and the whole electro-luminescent display device becomes a transparent display. In its metallic form, the metal-hydride switchable mirror has a maximum reflectivity of 70% in visible range, for example, the reflectivity may be 50%-70%, and the whole electro-luminescent display device becomes a conventional non-transparent display.

As described above, by the incorporation of a switchable mirror into a light emitting display device structure, the light emitting display device can be easily and effectively switched between transparent and non-transparent display types.

The aforesaid embodiments are only exemplary embodiments of present disclosure, and do not intend to limit the scope of present disclosure. The scope of present disclosure is determined by the appended claims.

The invention claimed is:

1. A light emitting display device comprising one or more pixel units, each of which is provided with a transparent light emitting device on a substrate, wherein
at least one of the pixel units is provided with a switchable mirror, which is located between the substrate and the light emitting device and is switchable between a transmission mode and a reflection mode.

2. The light emitting display device according to claim 1, wherein the switchable mirror is a metal-hydride switchable mirror.

3. The light emitting display device according to claim 2, wherein the switchable mirror comprises a bottom transparent electrode, a hydrogen storage electrode, a proton conducting layer, an active layer switchable between a metallic reflection state and a metal hydride transmission state, and a sealing layer, which are stacked from bottom to top, wherein the proton conducting layer and the sealing layer are connected with each other.

4. The light emitting display device according to claim 1, wherein the switchable mirror comprises a bottom transparent electrode, a hydrogen storage electrode, a proton conducting layer, an active layer switchable between a metallic reflection state and a metal hydride transmission state, and a sealing layer, which are stacked from bottom to top, wherein the proton conducting layer and the sealing layer are connected with each other.

5. The light emitting display device according to claim 4, further comprising a first switching transistor, a drain electrode of which is connected with the bottom transparent electrode, for controlling the switchable mirror to switch between the transmission mode and the reflection mode.

6. The light emitting display device according to claim 5, further comprising a second switching transistor, a drain electrode of which is connected with a pixel electrode of the light emitting device, for controlling whether to provide a data signal to the light emitting device.

7. The light emitting display device according to claim 4, wherein the hydrogen storage electrode is made of a hydrogen storage alloy selected from at least one of $WO_3$, $NdMgNi_{4-a}Co_a$, $Ti_{0.5}Al_{0.25}Ni_{0.25}$ and $ZrMn_wM_xCr_yNi_z$, wherein
in $NdMgNi_{4-a}Co_a$, a is in a range of 0-1.0; and
in $ZrMn_wM_xCr_yNi_z$, M is V or Mo, $0.6 \leq w \leq 0.8$, $0.1 \leq x \leq 0.3$, $0 < y \leq 0.2$, and $1.2 \leq z \leq 1.5$.

8. The light emitting display device according to claim 4, wherein the proton conducting layer and the sealing layer are made of a proton conducting material selected from at least one of $ZrO_2$, $SrCeO_3$, $BaCeO_3$ and $BaZrO_3$, and wherein $H^+$ is capable of being filled in pores of the proton conducting material.

9. The light emitting display device according to claim 4, wherein the active layer is made of a material selected from at least one of GdMg, $Mg_2Ni$, YMg and LaMg.

10. The light emitting display device according to claim 1, wherein the switchable mirror and the light emitting device are arranged to be directly opposite to each other.

11. The light emitting display device according to claim 10, wherein a planarization layer is arranged between the switchable mirror and the light emitting device such that the switchable mirror and the light emitting device are directly opposite to each other.

12. The light emitting display device according to claim 1, wherein the switchable mirror has a thickness of 80 nm-120 nm.

13. The light emitting display device according to claim 1, wherein the light emitting device comprises a pixel electrode, a light emitting layer, and a counter electrode directly opposite to the pixel electrode stacked in sequence.

14. The light emitting display device according to claim 1, wherein each pixel unit comprises one or more subpixel units, each of which is provided with one said switchable mirror.

15. The light emitting display device according to claim 1, wherein each pixel unit is a pixel unit composed of a plurality of subpixels in different colors, and wherein the each pixel unit is provided with one said switchable mirror.

16. A method for manufacturing a light emitting display device, comprising:
   forming, in at least one of pixel units on a substrate, a switchable mirror which is switchable between a transmission mode and a reflection mode; and
   forming a transparent light emitting device on the switchable mirror.

17. The method for manufacturing a light emitting display device according to claim 16, wherein the forming, in at least one of pixel units on a substrate, a switchable mirror which is switchable between a transmission mode and a reflection mode comprises:
   forming a bottom transparent electrode on the substrate;
   forming a hydrogen storage electrode on the bottom transparent electrode;
   forming a proton conducting layer on the hydrogen storage electrode;
   forming, on the proton conducting layer, an active layer switchable between a metallic reflectance state and a metal hydride transmission state; and
   forming a sealing layer on the active layer, wherein the proton conducting layer and the sealing layer are connected with each other.

18. The method for manufacturing a light emitting display device according to claim 17, further comprising:
   forming a first switching transistor and a second switching transistor before forming the switchable mirror, wherein:
   the first switching transistor and the second switching transistor are formed through a same process;
   a drain electrode of the first switching transistor is connected with the bottom transparent electrode, for controlling the switchable mirror to switch between the transmission mode and the reflection mode; and
   a drain electrode of the second switching transistor is connected with a pixel electrode of the light emitting device, for controlling whether to provide a data signal to the light emitting device.

* * * * *